(12) United States Patent
Tawara et al.

(10) Patent No.: US 10,418,477 B2
(45) Date of Patent: Sep. 17, 2019

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Takeshi Tawara, Matsumoto (JP); Akimasa Kinoshita, Matsumoto (JP); Shinsuke Harada, Tsukuba (JP); Yasunori Tanaka, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/800,653

(22) Filed: Nov. 1, 2017

(65) Prior Publication Data
US 2018/0182887 A1 Jun. 28, 2018

(30) Foreign Application Priority Data
Dec. 28, 2016 (JP) .................................. 2016-256889

(51) Int. Cl.
*H01L 29/78* (2006.01)
*H01L 29/16* (2006.01)
(Continued)

(52) U.S. Cl.
CPC ........ *H01L 29/7813* (2013.01); *H01L 29/045* (2013.01); *H01L 29/1608* (2013.01); *H01L 29/66068* (2013.01); *H01L 29/7811* (2013.01)

(58) Field of Classification Search
CPC ............... H01L 29/7813; H01L 29/045; H01L 29/7811; H01L 29/1608; H01L 29/6608
See application file for complete search history.

(56) References Cited

U.S. PATENT DOCUMENTS 6,853,006 B2 * 2/2005 Kataoka ................ H01L 29/045
257/192
7,399,676 B2 * 7/2008 Kumar ................ H01L 29/7813
257/E21.054
(Continued)

FOREIGN PATENT DOCUMENTS

JP 2012-234908 A 11/2012

OTHER PUBLICATIONS

J. Tan et al., "High-Voltage Accumulation-Layer UMOSFET's in 4H-SiC", IEEE Electron Device Letters, vol. 19, No. 12, pp. 487-489, Dec. 1989.

*Primary Examiner* — William Coleman
(74) *Attorney, Agent, or Firm* — Rabin & Berdo, P.C.

(57) ABSTRACT

A silicon carbide semiconductor device, including a silicon carbide substrate, a drift layer provided on a front surface of the silicon carbide substrate, an embedded layer selectively provided in a surface layer of the drift layer, an epitaxial layer provided on the drift layer, a channel layer provided on the epitaxial layer, a source region selectively provided in a surface layer of the channel layer, a trench penetrating the source region and the channel layer and reaching the epitaxial layer, a gate electrode provided in the trench via a gate insulating film, a source electrode in contact with the channel layer and the source region, and a drain electrode provided on a rear surface of the silicon carbide substrate. The embedded layer is arranged underneath the trench in a depth direction. A longitudinal direction of the trench, which is perpendicular to the depth direction, is parallel to the off-direction of the silicon carbide substrate.

8 Claims, 19 Drawing Sheets

(51) Int. Cl.
  *H01L 29/66*    (2006.01)
  *H01L 29/04*    (2006.01)

(56) References Cited

U.S. PATENT DOCUMENTS

| | | | | |
|---|---|---|---|---|
| 7,825,449 B2* | 11/2010 | Suzuki | H01L 29/0619 |
| | | | 257/301 |
| 8,395,162 B2* | 3/2013 | Nakano | H01L 21/046 |
| | | | 257/77 |
| 8,415,671 B2* | 4/2013 | Zhang | H01L 29/0623 |
| | | | 257/66 |
| 8,525,223 B2* | 9/2013 | Watanabe | H01L 29/045 |
| | | | 257/130 |
| 8,598,652 B2* | 12/2013 | Takaya | H01L 29/0623 |
| | | | 257/331 |
| 8,686,435 B2* | 4/2014 | Masuda | H01L 21/3065 |
| | | | 257/622 |
| 8,735,906 B2* | 5/2014 | Nakano | H01L 29/7813 |
| | | | 257/139 |
| 9,337,298 B2* | 5/2016 | Takeuchi | H01L 29/4236 |
| 9,647,108 B2* | 5/2017 | Suzuki | H01L 29/66068 |
| 9,741,979 B2* | 8/2017 | Tamura | H01M 2/08 |
| 9,793,376 B2* | 10/2017 | Miyahara | H01L 21/049 |
| 9,818,818 B2* | 11/2017 | Rupp | H01L 29/045 |
| 9,825,121 B2* | 11/2017 | Iijima | H01L 29/78 |
| 2012/0273801 A1 | 11/2012 | Watanabe et al. | |
| 2015/0236127 A1* | 8/2015 | Miyahara | H01L 29/66734 |
| | | | 257/77 |
| 2016/0190301 A1* | 6/2016 | Aichinger | H01L 29/739 |
| | | | 257/77 |
| 2016/0211354 A1* | 7/2016 | Ikura | H01L 29/402 |

\* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-256889, filed on Dec. 28, 2016, the entire contents of which are incorporated herein by reference.

BACKGROUND OF THE INVENTION

1. Field of the Invention

Embodiments of the present invention relate to a silicon carbide semiconductor device and a method of manufacturing a silicon carbide semiconductor device.

2. Description of the Related Art

A silicon carbide (SiC) semiconductor element has various advantages such as enabling the resistance of the element in an ON state to be reduced to one several hundredths and use under higher temperature environments (equal to or higher than 200 degrees C.) compared to a conventional semiconductor element that uses silicon (Si) as a material. This is due to properties of the material itself such as the bandgap of SiC being substantially threefold larger than that of Si and the breakdown electric field intensity thereof being ten-fold higher than that of Si.

Until now, Schottky barrier diodes and planar vertical metal oxide semiconductor field effect transistors (MOSFETs) have been produced (manufactured) as commercial SiC semiconductor elements and, in addition, a vertical MOSFET of a trench gate structure (hereinafter, referred to simply as "trench MOSFET") has been proposed that aims to reduce element resistance by size reduction through increased channel density.

For a SiC trench MOSFET, two types of methods for forming a channel layer have been proposed, including an ion implantation method and an epitaxial growth method. When the channel layer is formed using ion implantation, a problem arises in that channel mobility is degraded due to crystal damage by the ion implantation and the roughness of the trench side wall surface after activation annealing.

On the other hand, when the channel layer is formed by epitaxial growth, although the channel mobility is improved, a problem arises in that a marker pattern for photolithography steps is deformed when the epitaxial growth (hereinafter, referred to simply as "epi growth") is performed. The alignment precision is therefore degraded between before and after the epi growth and this imposes a significant restriction on the element structure and the method of manufacture.

For a SiC trench MOSFET, according to a conventional technique, a p-type layer is embedded at the bottom of a trench to protect an oxide film at the bottom of the trench (see, e.g., IEEE ELECTRON DEVICE LETTERS, 19, (1989) p. 487). FIG. 23 is a cross-sectional view of a structure of a conventional SiC trench device. FIG. 23 depicts a structure of a SiC trench device whose channel layer is formed by epi growth and that includes a structure in which a p-type layer is embedded at the trench bottom.

As depicted in FIG. 23, the conventional SiC trench device includes an $n^-$-type drift layer 2, a p-type embedded layer 3, an n-type epitaxial layer 4, and a p-type epitaxial layer 5 provided on an $n^+$-type silicon carbide substrate 1. A $p^+$-type contact layer 6 and an $n^+$-type source layer 7 are selectively provided in the p-type epitaxial layer 5. The conventional SiC trench device includes a source electrode 8, an interlayer insulating film 9, an electrode pad 10, a trench 11, a gate electrode 12, a gate oxide film 13, a drain electrode 14, and a rear electrode 15, and the p-type embedded layer 3 is embedded at the bottom of the trench 11.

FIGS. 24, 25, 26, 27, and 28 are cross-sectional views of the conventional SiC trench device during manufacture. When the channel layer is formed by epi growth, as depicted in FIG. 24, the $n^-$-type drift layer 2 on the $n^+$-type silicon carbide substrate 1 is first formed by epi growth. As depicted in FIG. 25, the p-type embedded layer 3 is formed in the $n^-$-type drift layer 2 by ion implantation. Arrows in FIG. 25 indicate a region into which ions are implanted.

As depicted in FIG. 26, the n-type epitaxial layer 4 and the p-type epitaxial layer 5 to become the channel layer are formed on the $n^-$-type drift layer 2 and the p-type embedded layer 3 by epi growth. As depicted in FIG. 27, the $p^+$-type contact layer 6 and the $n^+$-type source layer 7 are formed in the p-type epitaxial layer 5 by ion implantation. As depicted in FIG. 28, the trench 11 is formed by aligning a position thereof with a position of the p-type embedded layer 3. The source electrode 8, the interlayer insulating film 9, the electrode pad 10, the gate electrode 12, the gate oxide film 13, the drain electrode 14, and the rear electrode 15 are finally formed, and the SiC trench device depicted in FIG. 23 is thereby completed.

For the SiC trench device, according to a conventional technique, effects of step bunching are avoided and reduction of the dielectric breakdown and the life of the gate insulating film is suppressed by forming the trench using a <1-100> direction of the SiC semiconductor substrate as the longitudinal direction thereof (see, e.g., Japanese Laid-Open Patent Publication No. 2012-234908).

SUMMARY OF THE INVENTION

According to one aspect of the present invention, a silicon carbide semiconductor device includes a silicon carbide substrate of a first conductivity type and having an off-angle; a drift layer of the first conductivity type provided on a front surface of the silicon carbide substrate, an impurity concentration of the drift layer is lower than that of the silicon carbide substrate; an embedded layer of a second conductivity type selectively provided in a surface layer on a first side of the drift layer opposite a second side of the drift layer facing the silicon carbide substrate; an epitaxial layer of the first conductivity type provided on a surface on the first side of the drift layer, an impurity concentration of the epitaxial layer is higher than that of the drift layer; a channel layer of the second conductivity type provided on a surface on a first side of the epitaxial layer opposite a second side of the epitaxial layer facing toward the silicon carbide substrate; a source region of the first conductivity type selectively provided in a surface layer on a first side of the channel layer opposite a second side of the channel layer facing toward the silicon carbide substrate; a trench penetrating the source region and the channel layer and reaching the epitaxial layer; a gate electrode provided in the trench, via a gate insulating film; a source electrode in contact with the channel layer and the source region; and a drain electrode provided on a rear surface of the silicon carbide substrate. The embedded layer is arranged at a position to face the trench in a depth direction. The trench has a striped planar pattern, and a longitudinal direction of the trench is parallel to an off-direction of the silicon carbide substrate.

The silicon carbide semiconductor device includes a mesa structure formed by partially removing the channel layer. The embedded layer is longer than the channel layer by a distance from 1 μm to 100 μm in a direction of an edge termination region provided in an outer periphery of the silicon carbide substrate. The edge termination region and an end portion of the embedded layer are separated from each other by more than the distance.

In the silicon carbide semiconductor device, the off-direction of the silicon carbide substrate is a <11-20> direction, and the longitudinal direction of the trench is a <11-20> direction.

According to another aspect of the present invention, a method of manufacturing a silicon carbide semiconductor device includes forming a drift layer of a first conductivity type on a front surface of a silicon carbide substrate of the first conductivity type, an impurity concentration of the drift layer is lower than that of the silicon carbide substrate; selectively forming an embedded layer of a second conductivity type in a surface layer of the drift layer; forming an epitaxial layer of the first conductivity type on a surface of the drift layer, an impurity concentration of the epitaxial layer is higher than that of the drift layer; forming a channel layer of the second conductivity type on a surface of the epitaxial layer; selectively forming a source region of the first conductivity type on a surface layer of the channel layer; forming a trench penetrating the source region and the channel layer and reaching the epitaxial layer to have a striped planar pattern, the trench being formed at a position to face the embedded layer in a depth direction; forming a gate electrode in the trench, via a gate insulating film; forming an interlayer insulating film on the gate electrode; forming a source electrode in contact with the channel layer and the source region; and forming a drain electrode on a rear surface of the silicon carbide substrate. Forming of the trench includes setting a longitudinal direction of the trench to be parallel to an off-direction of the silicon carbide substrate.

The method includes forming an edge termination region in an outer periphery of the silicon carbide substrate; and setting the embedded layer to be longer than the channel layer by a distance from 1 μm to 100 μm in a direction of the edge termination region provided in the outer periphery of the silicon carbide substrate, by partially removing the channel layer. Forming of the embedded layer includes forming the embedded layer such that the edge termination region and an end portion of the embedded layer are separated from each other by more than the distance.

In the method, the epitaxial layer and the channel layer are formed by epitaxial growth.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
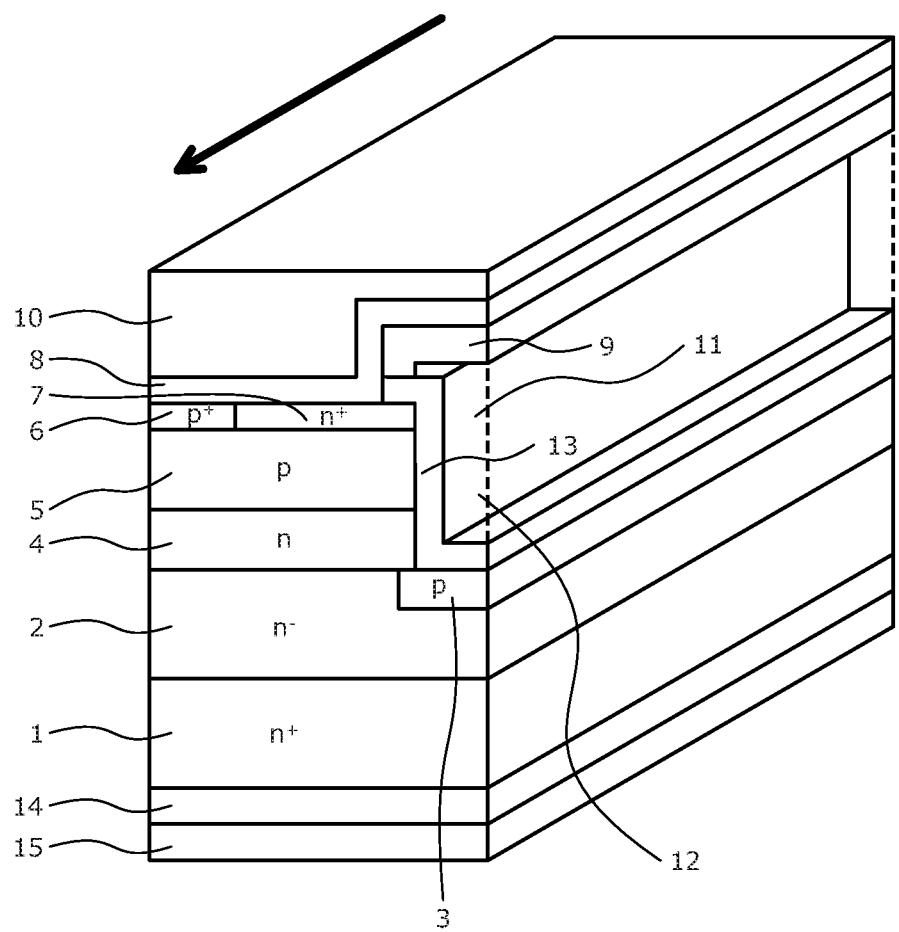
FIG. 1 is a perspective cross-sectional view of a configuration of a silicon carbide semiconductor device according to an embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

First, issues related to the conventional techniques will be discussed. In the convention techniques, when the p-type embedded layer is formed at the trench bottom, the position of an opening of a mask may be shifted when the mask is formed using a marker pattern as the reference because the precision of the marker pattern is low. In this case, the positions of the bottom of the trench and the p-type embedded layer formed using this mask may be shifted with respect to each other. Therefore, the width of the p-type embedded layer is increased to prevent any problems that may arise when the positions of the p-type embedded layer and the trench bottom are shifted with respect to each other.

Figure 23:
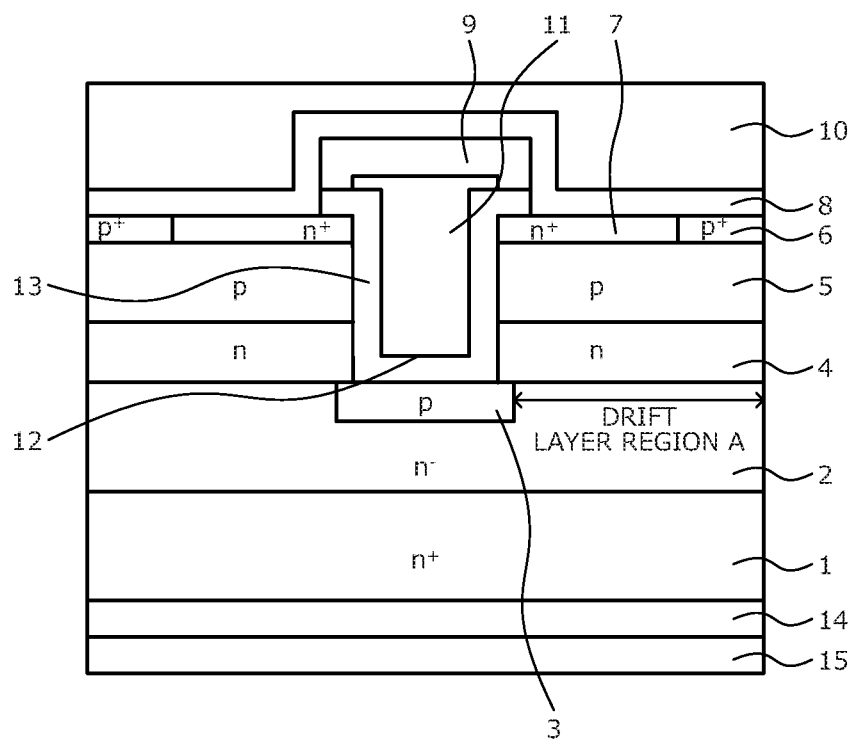
FIG. 23 is a cross-sectional view of a structure of a conventional SiC trench device.
Figure 24:
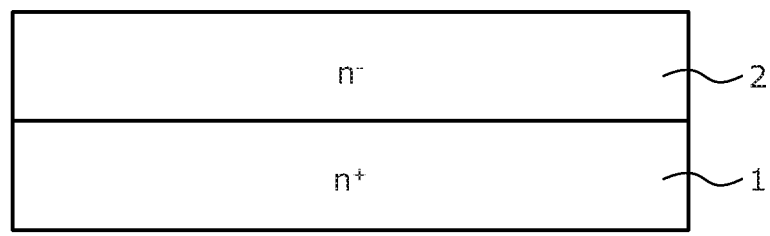
FIGS. 24, 25, 26, 27, and 28 are cross-sectional views of the conventional SiC trench device during manufacture.
Figure 25:
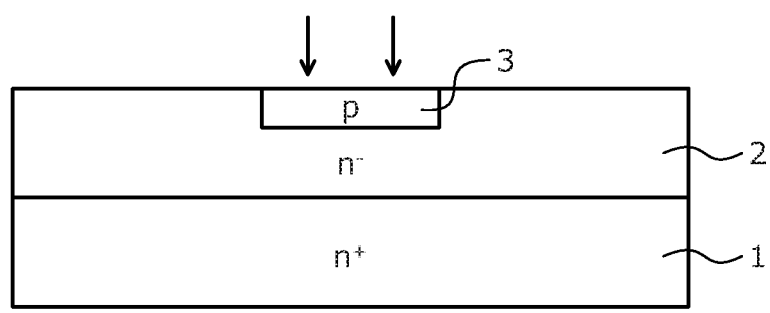
Figure 26:
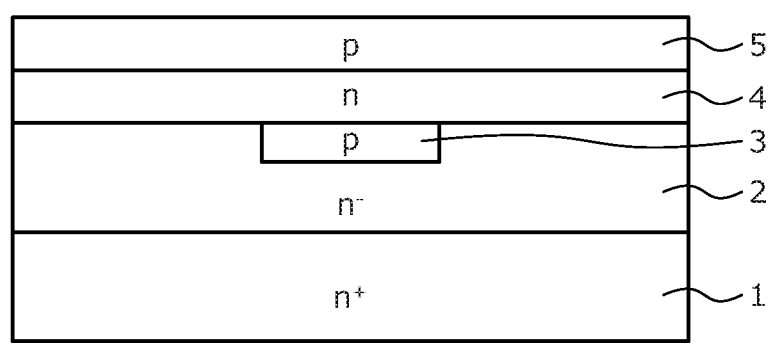
Figure 27:
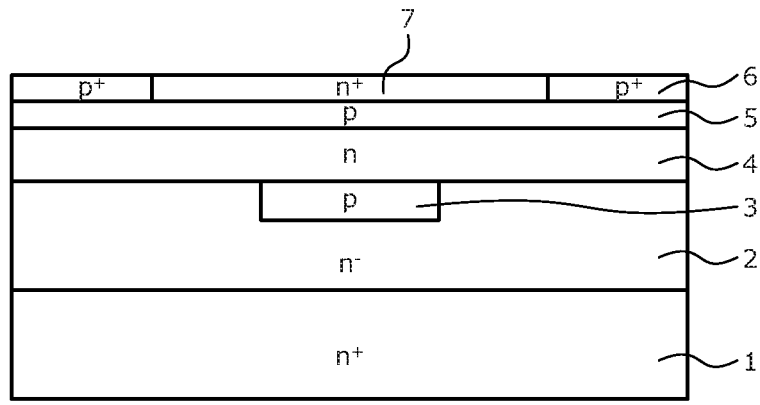
Figure 28:
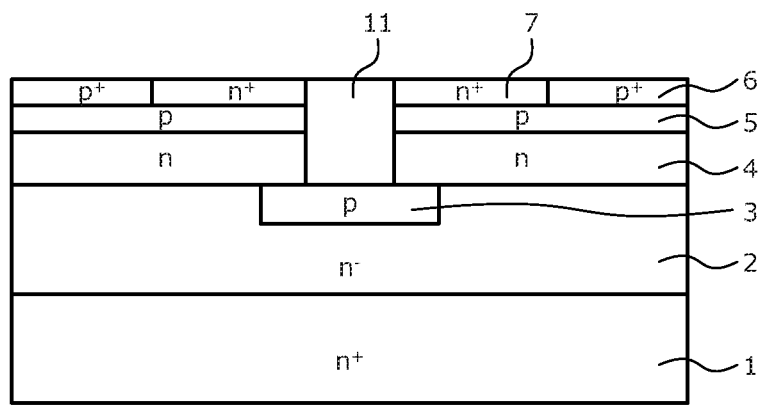

As a result, the width of a region between the drift layer and the source layer (for example, a drift layer region A in FIG. 23) is reduced and the resistance between the drift layer and the source layer is increased. Therefore, a problem arises in that the resistance of the element is increased.

When the p-type embedded layer is formed by ion implantation after the trench is formed and the width of the trench is decreased to be equal to or smaller than about 1 μm, a problem arises in that ions are implanted not only into the bottom of the trench but also into the side wall of the trench.

For the trench MOSFET including the p-type epitaxial layer, when the trench is formed setting the <1-100> direction of the SiC semiconductor substrate to be the longitudinal direction thereof, no effect of protecting the oxide film in the trench bottom is obtained due to degradation of the alignment precision caused by the deformation of the marker pattern. Therefore, a problem arises in that the gate oxide film is destroyed by a low electric field.

Next, the semiconductor device according to the present invention will be described taking as an example of a MOSFET whose element structure is a stripe-shaped cell, a silicon carbide semiconductor device manufactured using a silicon carbide substrate. FIG. 1 is a perspective cross-sectional view of a configuration of the silicon carbide semiconductor device according to the embodiment.

As depicted in FIG. 1, the silicon carbide semiconductor device according to the embodiment has an $n^-$-type drift layer (a drift layer of a first conductivity type) 2 deposited on a first main surface (a front surface) such as, for example, a (0001) face (a Si face) of an $n^+$-type silicon carbide substrate (a silicon carbide substrate of the first conductivity type). The $n^+$-type silicon carbide substrate 1 is a single-crystal silicon carbide substrate that has an off-angle.

A p-type embedded layer (an embedded layer of a second conductivity type) 3 is selectively provided in a surface layer on a front side of the $n^-$-type drift layer 2 opposite a rear side of the $n^-$-type drift layer 2 facing the $n^+$-type silicon carbide substrate 1. The p-type embedded layer 3 is a region that protects a gate oxide film (a gate insulating film) 13 on the bottom of a trench 11 described later. An n-type epitaxial layer (an epitaxial layer of the first conductivity type) 4 is provided on the front side of the $n^-$-type drift layer 2. The n-type epitaxial layer 4 is an n-type drift layer whose impurity concentration is lower than that of the $n^+$-type silicon carbide substrate 1 and is higher than that of the $n^-$-type drift layer 2. A p-type epitaxial layer (a channel layer of the second conductivity type) 5 is provided on a front side of the n-type epitaxial layer 4 opposite a rear side of the n-type epitaxial layer 4 facing toward the $n^+$-type silicon carbide substrate 1. The p-type epitaxial layer 5 is a p-type channel layer. The $n^+$-type silicon carbide substrate 1, the $n^-$-type drift layer 2, the n-type epitaxial layer 4, and the p-type epitaxial layer 5 will hereinafter be referred to collectively as "silicon carbide semiconductor base substrate".

A $p^+$-type contact layer 6 and an $n^+$-type source layer (a source region of the first conductivity type) 7 are selectively provided on a first main surface side of the silicon carbide semiconductor base substrate in the p-type epitaxial layer 5.

A drain electrode 14 is provided on a second main surface (rear surface, that is, the rear surface of the silicon carbide semiconductor base substrate) of the silicon carbide semiconductor base substrate. A rear electrode 15 is provided on a surface of the drain electrode 14.

A trench gate structure is provided on the first main surface side (the p-type epitaxial layer 5 side) of the silicon carbide semiconductor base substrate. For example, the trench 11 has a striped planar pattern and penetrates the p-type epitaxial layer 5 from a surface on a front side of the p-type epitaxial layer 5 opposite a rear side of the p-type epitaxial layer 5 facing toward the $n^+$-type silicon carbide substrate 1 (the first main surface side of the silicon carbide semiconductor base substrate) and reaches the n-type epitaxial layer 4. A gate oxide film 13 is provided on the bottom portion and the side wall of the trench 11 along the inner wall of the trench 11, and a gate electrode 12 is provided on the gate oxide film 13 in the trench 11. The gate electrode 12 is insulated from the n-type epitaxial layer 4 and the p-type epitaxial layer 5 by the gate oxide film 13. A portion of the gate electrode 12 may protrude from a top of the trench 11 (the electrode pad 10 side) toward the electrode pad 10.

The p-type embedded layer 3 is provided at a position to face the bottom portion of the trench 11 in the depth direction. The width of the p-type embedded layer 3 is larger than the width of the trench 11. The bottom portion of the trench 11 may reach the p-type embedded layer 3, or may be positioned in the n-type epitaxial layer 4 sandwiched by the p-type epitaxial layer 5 and the p-type embedded layer 3 and needs not be in contact with the p-type embedded layer 3.

FIG. 1 depicts only one trench MOS structure while more trench-structure MOS gates (each an insulated gate including a metal oxide semiconductor) may be arranged in parallel to each other.

The interlayer insulating film 9 is provided on the entire first main surface side of the silicon carbide semiconductor base substrate so as to cover the gate electrode 12 embedded in the trench 11. The source electrode 8 is in contact with the $p^+$-type contact layer 6 and the $n^+$-type source layer 7 through a contact hole opened in the interlayer insulating film 9. The source electrode 8 is electrically insulated from the gate electrode 12 by the interlayer insulating film 9. The electrode pad 10 is provided on the source electrode 8.

Figure 2A:
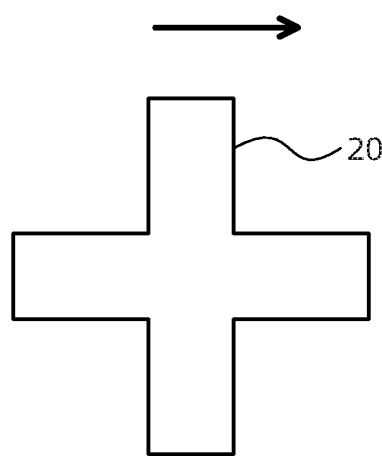
FIGS. 2A and 2B are diagrams of deformation of a marker pattern caused by epitaxial growth.
Figure 2B:
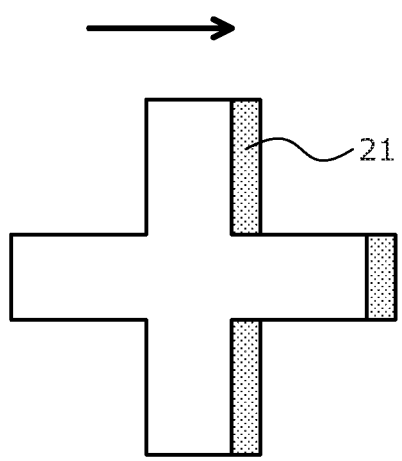

The inventors conducted an experiment and from the results, it was clear that the deformation of a marker pattern caused by the epi growth was significant in the direction parallel to the off-direction of the $n^+$-type silicon carbide substrate 1 and was slight in the direction perpendicular to the off-direction. FIGS. 2A and 2B are diagrams of the deformation of a marker pattern caused by the epitaxial growth. In FIGS. 2A and 2B, arrows indicate the off-direction of the substrate. FIG. 2A depicts the marker pattern before the epi growth, and FIG. 2B depicts the marker pattern after the epi growth.

As depicted in FIG. 2B, the marker pattern 20 after the epi growth had no deformed portion present therein in the direction perpendicular to the off-direction and had a deformed portion 21 present therein in the direction parallel to the off-direction. It was also found that the amount of the deformation of the marker pattern varied depending on the off-angle of the $n^+$-type silicon carbide substrate 1, the depth of the marker pattern, and the thicknesses of the n-type epitaxial layer 4 and the p-type epitaxial layer 5.

In the embodiment, as depicted in FIG. 1, the longitudinal direction of the trench 11 is therefore provided to be parallel to the off-direction of the $n^+$-type silicon carbide substrate 1. As a result, the width direction of the trench 11 is set to be a direction perpendicular to the off-direction and the deformation of the marker pattern decreases. Therefore, the positions of the p-type embedded layer 3 and the bottom of the trench 11 may be prevented from shifting with respect to each other and breakage of the gate oxide film 13 may be prevented.

Figure 3:
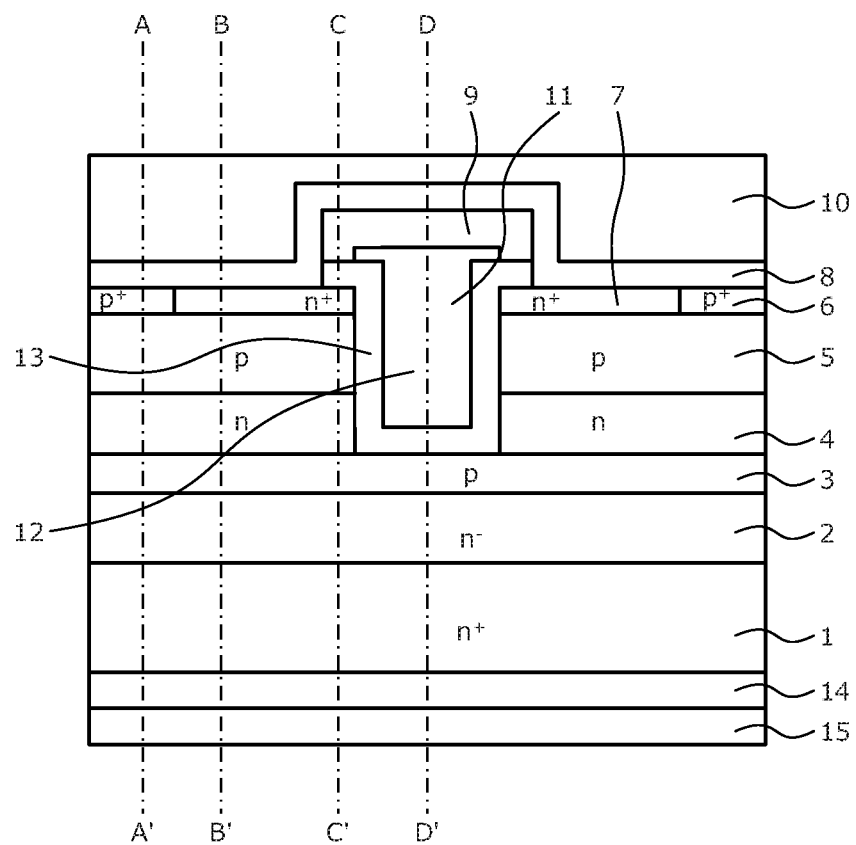
FIG. 3 is a cross-sectional view of a configuration of the silicon carbide semiconductor device according to the embodiment.
Figure 4:
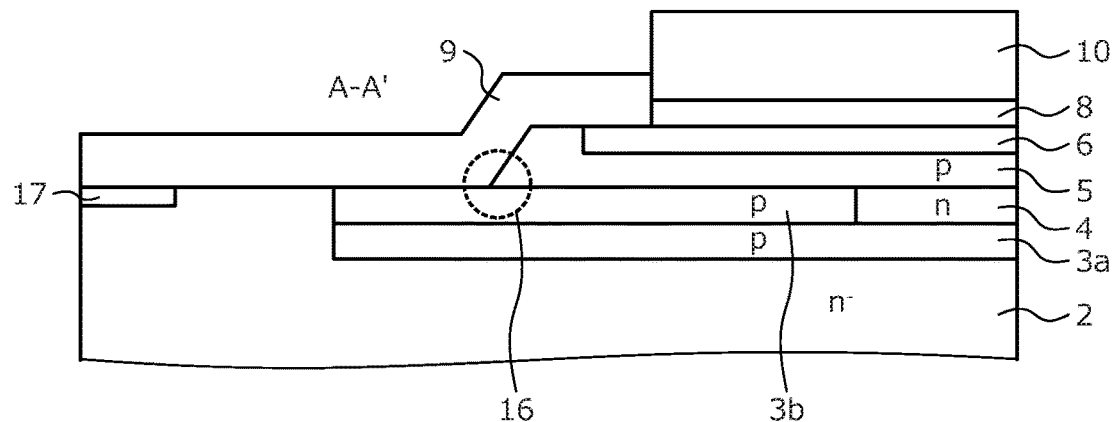
FIGS. 4, 5, 6, and 7 are cross-sectional views of an A-A' portion, a B-B' portion, a C-C' portion, and a D-D' portion, respectively, each depicting the configuration of a terminating portion of the silicon carbide semiconductor device according to the embodiment.
Figure 5:
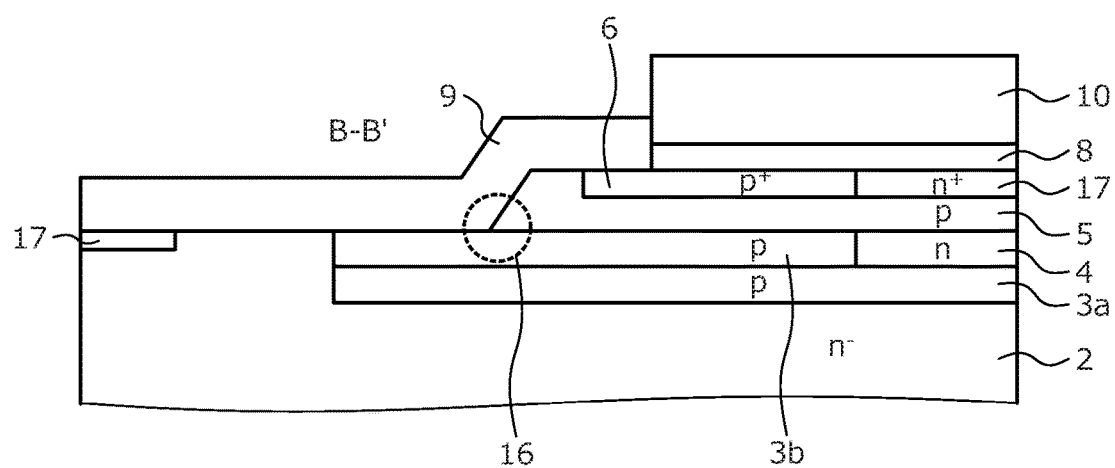
Figure 6:
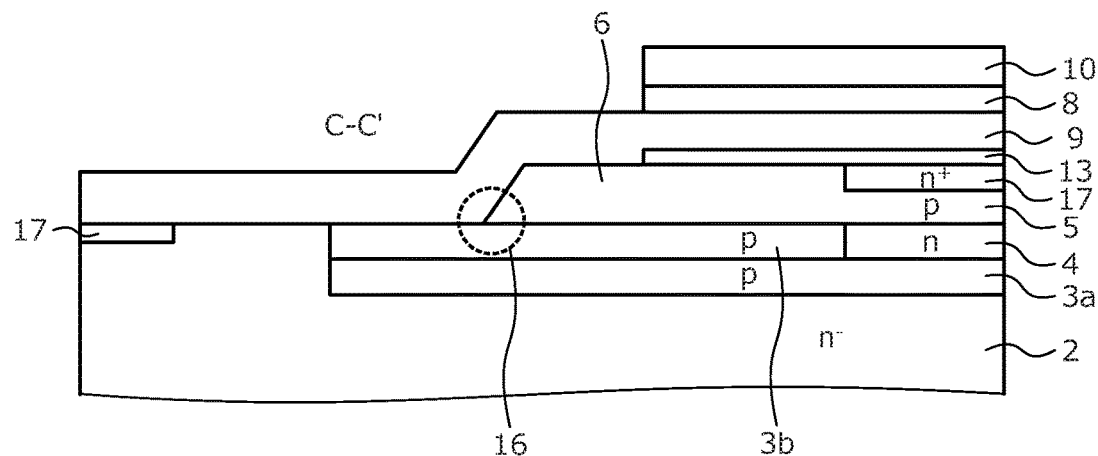
Figure 7:
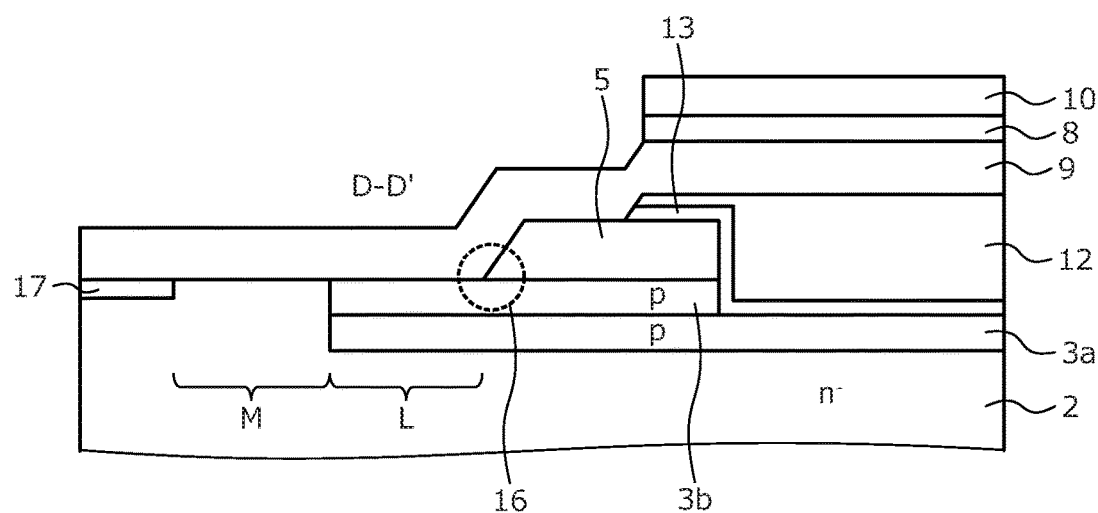
Figure 8:
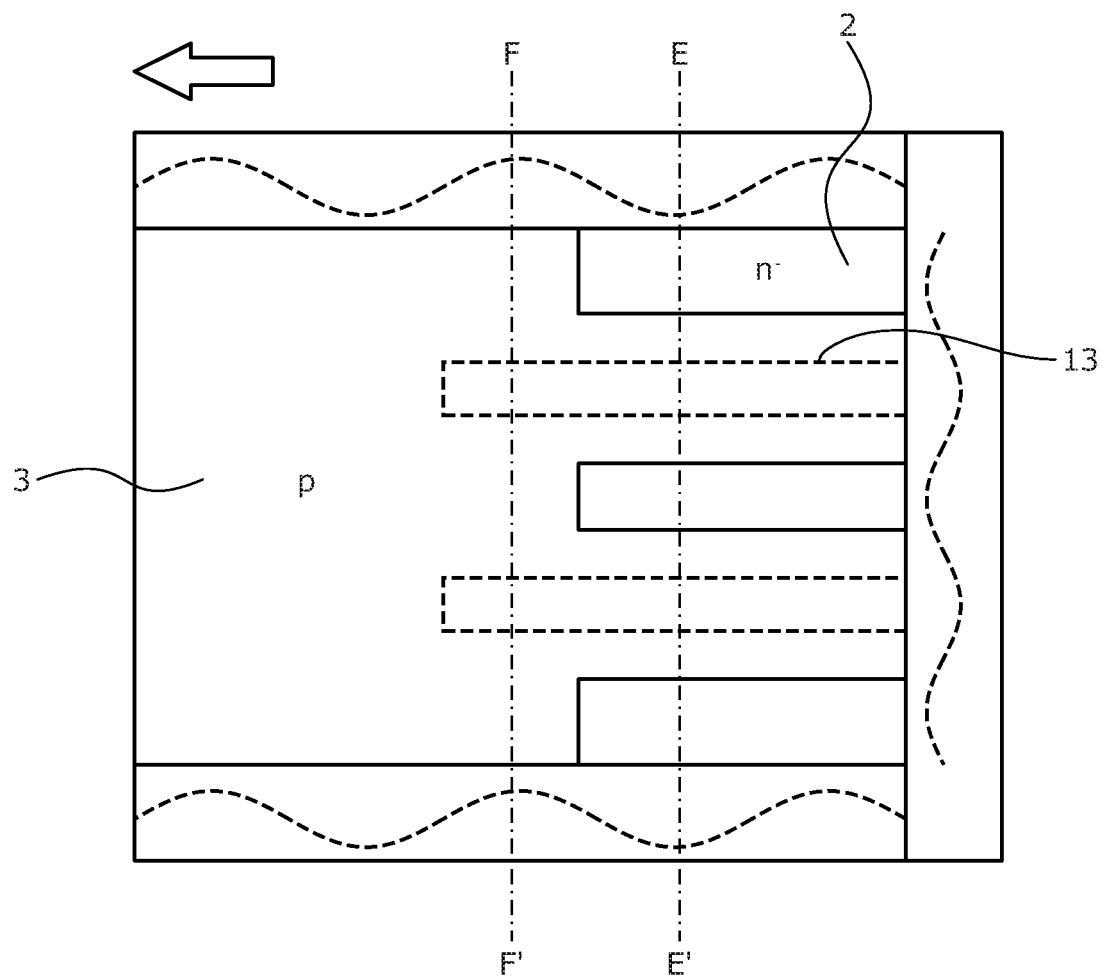
FIG. 8 is a top view of the configuration of the silicon carbide semiconductor device according to the embodiment.
Figure 9:
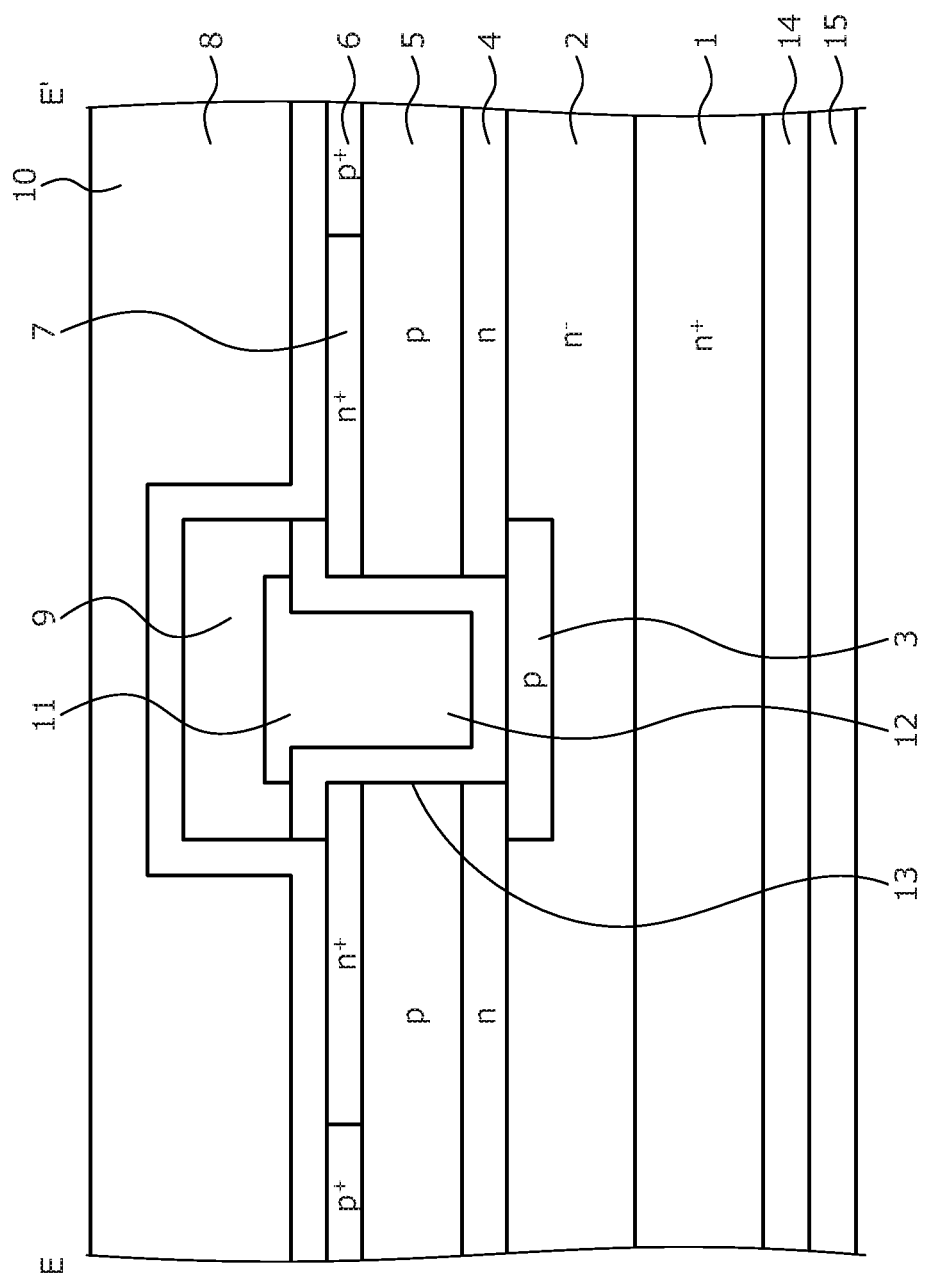
FIGS. 9 and 10 are cross-sectional views of an E-E' portion and an F-F' portion, respectively, each depicting the configuration of a terminating portion of the silicon carbide semiconductor device according to the embodiment.
Figure 10:
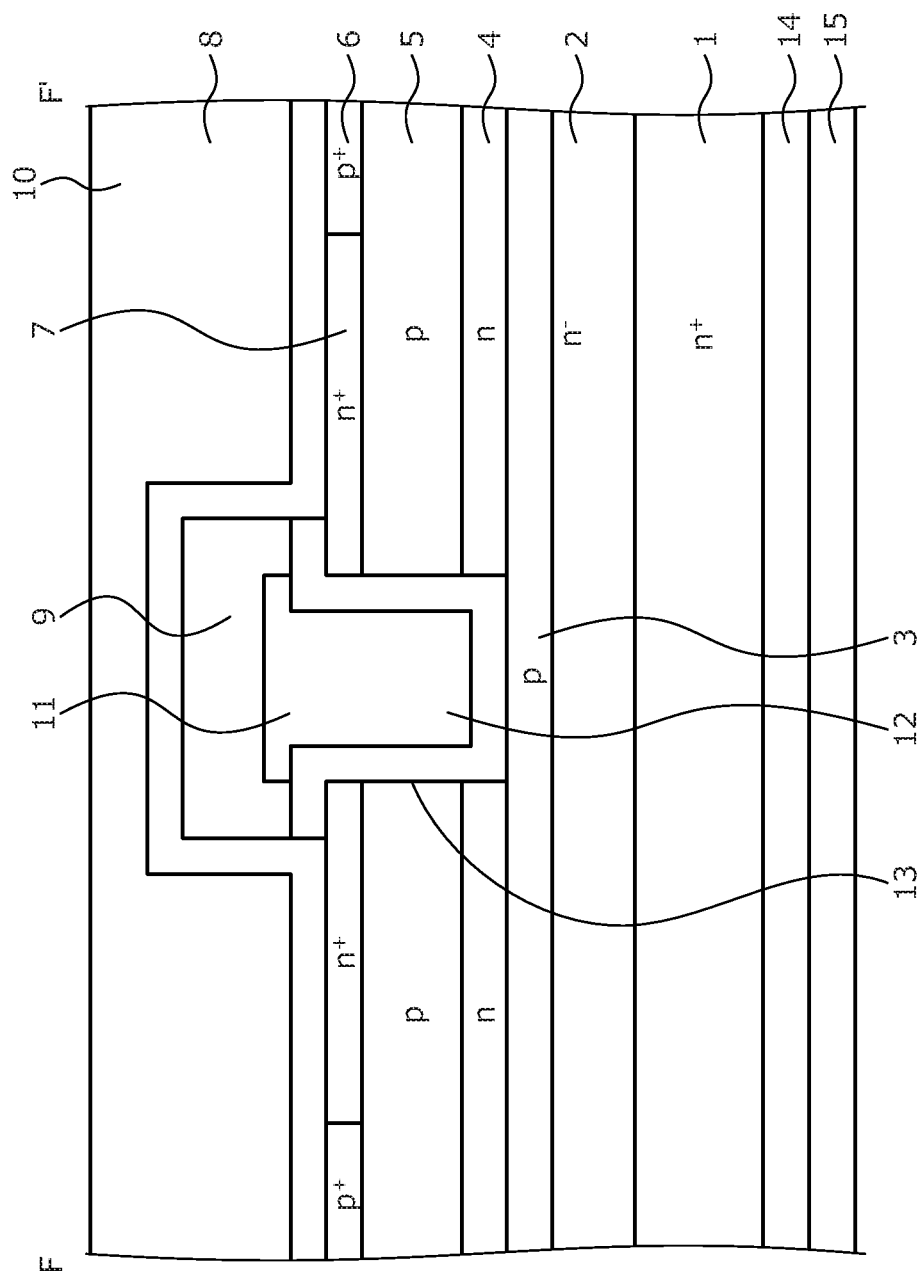

FIG. 3 is a cross-sectional view of a configuration of the silicon carbide semiconductor device according to the embodiment. FIGS. 4, 5, 6, and 7 are cross-sectional views of an A-A' portion, a B-B' portion, a C-C' portion, and a D-D' portion, respectively, each depicting the configuration of the silicon carbide semiconductor device according to the embodiment. FIG. 8 is a top view of the silicon carbide semiconductor device according to the embodiment. In FIG. 8, an arrow indicates the terminating portion side. FIGS. 9 and 10 are cross-sectional views of an E-E' portion and an F-F' portion, respectively, each depicting the configuration of a terminating portion of the silicon carbide semiconductor device according to the embodiment.

In a high voltage semiconductor device like the silicon carbide semiconductor device, high voltage is applied not only to the active region in which the element structure is formed and through which a current flows in the ON state but also to an edge termination region that is provided in a periphery of the active region and maintains the breakdown voltage, and the electric field concentrates at the edge termination region. Therefore, an edge termination structure such as a junction termination extension (JTE) structure or a field limiting ring (FLR) structure is arranged in the edge termination region to improve the breakdown voltage of the high voltage semiconductor device overall by mitigating or dispersing the electric field in the edge termination region.

As depicted in FIGS. 4 to 7, an edge termination structure 17 is provided in the edge termination region of the trench MOSFET of the embodiment. For the MOS structure whose channel layer is formed using the p-type epitaxial layer 5, the edge termination structure 17 is provided in a portion in which the n⁻-type drift layer 2 is exposed by removing the p-type epitaxial layer 5 by etching.

A step (a mesa end portion 16) is produced in the portion in which the p-type epitaxial layer 5 is removed by etching. Because the electric field concentrates at the mesa end portion 16, the p-type embedded layer 3 has to be provided beneath the mesa end portion 16 (the n⁻-type drift layer 2 side) to protect the mesa end portion 16 from strong electric field generated during the operation of the element.

The deformation of the marker pattern is however significant in the longitudinal direction of the trench 11 when the longitudinal direction of the trench 11 is provided to be parallel to the off-direction of the n⁺-type silicon carbide substrate 1. Because the formation of the mesa end portion 16 is conducted after the formation of the p-type epitaxial layer 5, the etching removal position for the mesa end portion 16 may be shifted due to the deformation of the marker pattern, and the p-type embedded layer 3 may not be provided beneath the mesa end portion 16.

In the embodiment, to prevent the p-type embedded layer 3 from not being provided beneath the mesa end portion 16, the p-type embedded layer 3 is set to be longer than the p-type epitaxial layer 5 in the direction of the edge termination structure 17 as depicted in FIGS. 4 to 7. For example, a distance L from the mesa end portion 16 to the end portion of the p-type embedded layer 3 is set to be a length from 1 μm to 100 μm. When the distance L is excessively long, the influence on the chip size becomes significant and the number of chips can be obtained from the substrate is reduced. On the contrary, when the distance L is excessively short, the p-type embedded layer 3 cannot be provided beneath the mesa end portion 16 due to an alignment error generated at the photolithography step. In this case, for example, a distance M from the end portion of the p-type embedded layer 3 to the edge termination structure 17 may be a length equal to or longer than the distance L. Because, when the distance M is shorter than the distance L, the p-type embedded layer 3 is provided in a portion in which the edge termination structure 17 provided and the edge termination structure 17 cannot be provided.

Because the formation of the structures located higher than the edge termination structure 17 and the p-type epitaxial layer 5 (those on the opposite side of the n⁻-type drift layer 2) is conducted after the formation of the p-type epitaxial layer 5, the positions of the structures may be shifted relative to the position of the p-type embedded layer 3 due to the deformation of the marker pattern. The structure in which the p-type embedded layer 3 is provided beneath the mesa end portion 16 is however not broken in the cross-sectional views taken along the A-A' portion, the B-B' portion, the C-C' portion, and the D-D' portion because the p-type embedded layer 3 is set to be longer than the p-type epitaxial layer 5 in the direction of the edge termination structure 17.

When the marker pattern deformed after the formation of the p-type epitaxial layer 5 is illegible, the marker pattern may be put again at the same position as that of the deformed marker pattern after the formation of the p-type epitaxial layer 5.

Regarding a method of manufacturing of a silicon carbide semiconductor device according to the embodiment, FIGS. 11, 12, 13, 14, 15, 16, and 17 are cross-sectional views the silicon carbide semiconductor device according to the embodiment during manufacture.

Figure 11:
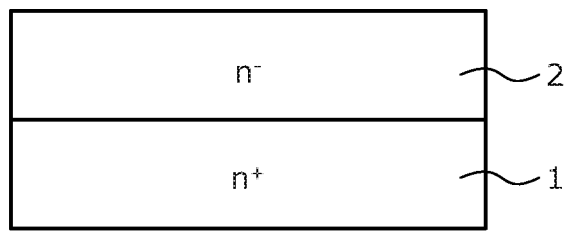
FIGS. 11, 12, 13, 14, 15, 16, and 17 are cross-sectional views the silicon carbide semiconductor device according to the embodiment during manufacture.

For example, an Si face substrate having an off-angle of 4 degrees in the <11-20> direction is used as the n⁺-type silicon carbide substrate 1. The n⁻-type drift layer 2 containing silicon carbide and having a thickness of 10 μm is epitaxial-grown on the first main surface (the front surface) of the n⁺-type silicon carbide substrate 1 with doping of an n-type impurity such as, for example, nitrogen atoms (N). FIG. 11 depicts the state established so far.

Figure 12:
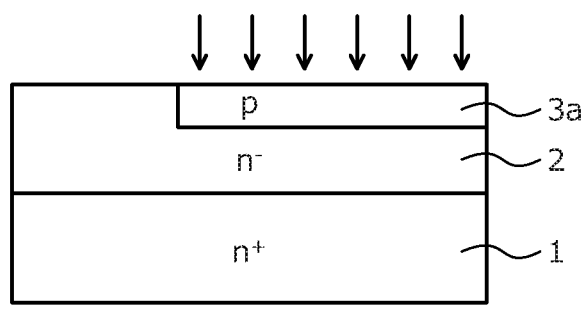

After photo patterning is performed, an alignment marker (not depicted) for photolithography processes is formed to have a cross shape by locally dry-etching the n⁻-type drift layer 2 to a depth of, for example, 1.2 μm. An oxide film is formed as an implantation mask layer and a photo patterning process using the alignment marker is performed. Thereafter, a p-type impurity such as, for example, aluminum (Al) is ion-implanted to form a first p-type embedded layer 3a that has, for example, a width of 2 μm and a depth of 0.5 μm and that extends in the <11-20> direction. FIG. 12 depicts the state established so far.

Figure 13:
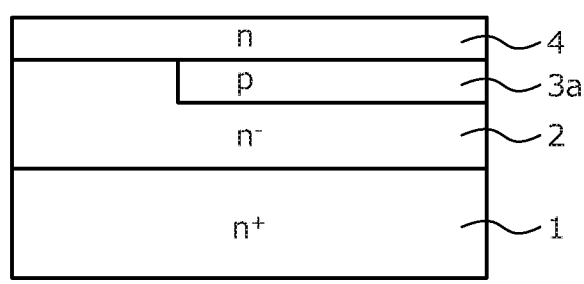

The n-type epitaxial layer 4, which has a thickness of 0.5 μm and an impurity concentration of $3 \times 10^{15}$ cm³, is epitaxial-grown on the surface of the n⁻-type drift layer 2 and the first p-type embedded layer 3a with doping of an n-type impurity such as, for example, nitrogen atoms. FIG. 13 depicts the state established so far.

Figure 14:
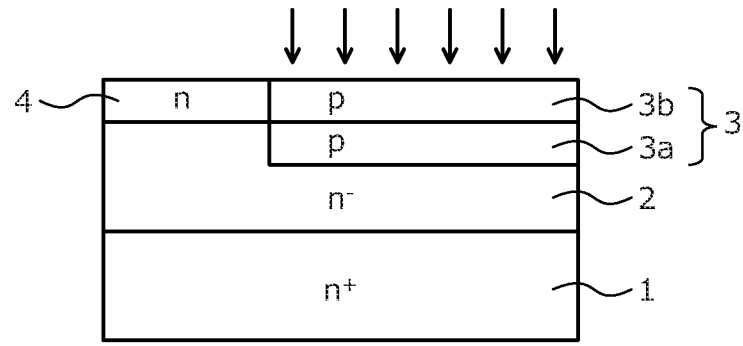

After photo patterning is performed, the n-type epitaxial layer 4 is locally inverted by the ion implantation of a p-type impurity such as, for example, Al to form a second p-type embedded layer 3b. The first p-type embedded layer 3a and the second p-type embedded layer 3b collectively constitute the p-type embedded layer 3. FIG. 14 depicts the state established so far.

Figure 15:
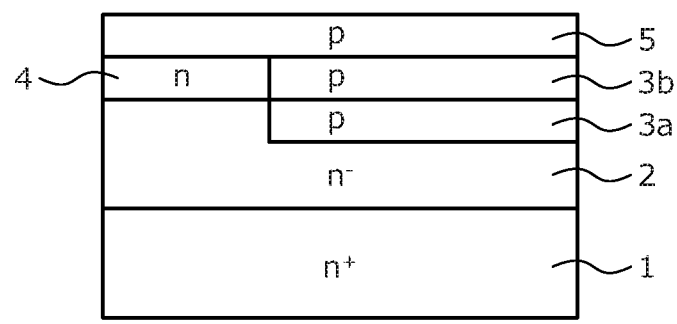

The p-type epitaxial layer 5, which has a thickness of 1.3 μm and an impurity concentration is $4 \times 10^{17}$ cm³, is epitaxial-grown on the surface of the n-type epitaxial layer 4 and the second p-type embedded layer 3b with doping of a p-type impurity. FIG. 15 depicts the state established so far.

Figure 16:
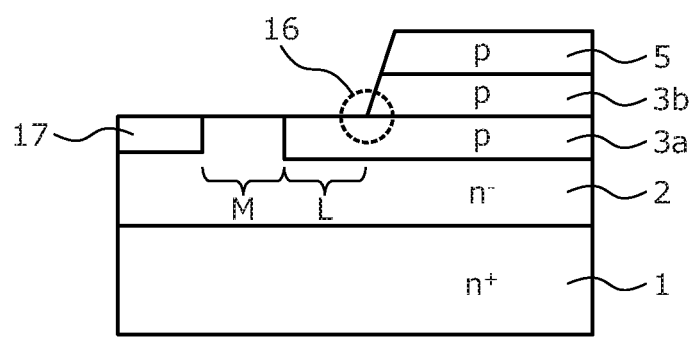

An etching mask (not depicted) and including a photoresist is formed on the p-type epitaxial layer 5 by a photo patterning process using the alignment marker to have a film thickness of 2.5 μm, and the p-type epitaxial layer 5 is thereafter partially removed by dry-etching. The etching mask is removed, and a p-type impurity such as, for example, Al is ion-implanted into the portion from which the p-type epitaxial layer 5 has been removed whereby the JTE edge termination structure 17 is formed therein. In this case, for example, the distance L between the mesa end portion 16 and the end portion of the p-type embedded layer 3 is set to be 3 μm and the distance M between the end portion of the p-type embedded layer 3 and the JTE edge termination structure 17 is set to be 4 μm. FIG. 16 depicts the state established so far.

Figure 17:
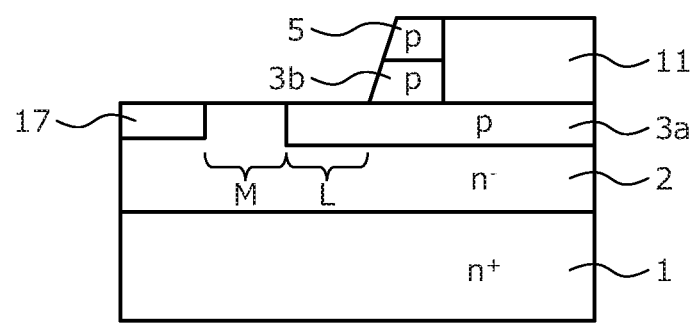

The $p^+$-type contact layer 6 (not depicted) and the $n^+$-type source layer 7 (not depicted) are formed by repeating the ion implantation and the photo patterning process, and an activation heat treatment is performed, for example, for 5 minutes at a temperature of 1,620 degrees C. in an argon (Ar) atmosphere. An etching mask (not depicted) constituted by an oxide film is formed to have a film thickness of 1 μm by a photo patterning process for the p-type epitaxial layer 5 and the SiC is thereafter dry-etched to form the trench 11 that has, for example, a depth of 2 μm and that extends, for example, in the <11-20> direction. The etching mask is removed. FIG. 17 depicts the state established so far.

The gate oxide film 13, the gate electrode 12, and the interlayer insulating film 9 are formed. A source contact hole is opened, and the source electrode 8, the drain electrode 14, the electrode pad 10, and the rear electrode 15 are formed. The trench MOSFET depicted in FIG. 1 is thereby completed.

Figure 18:
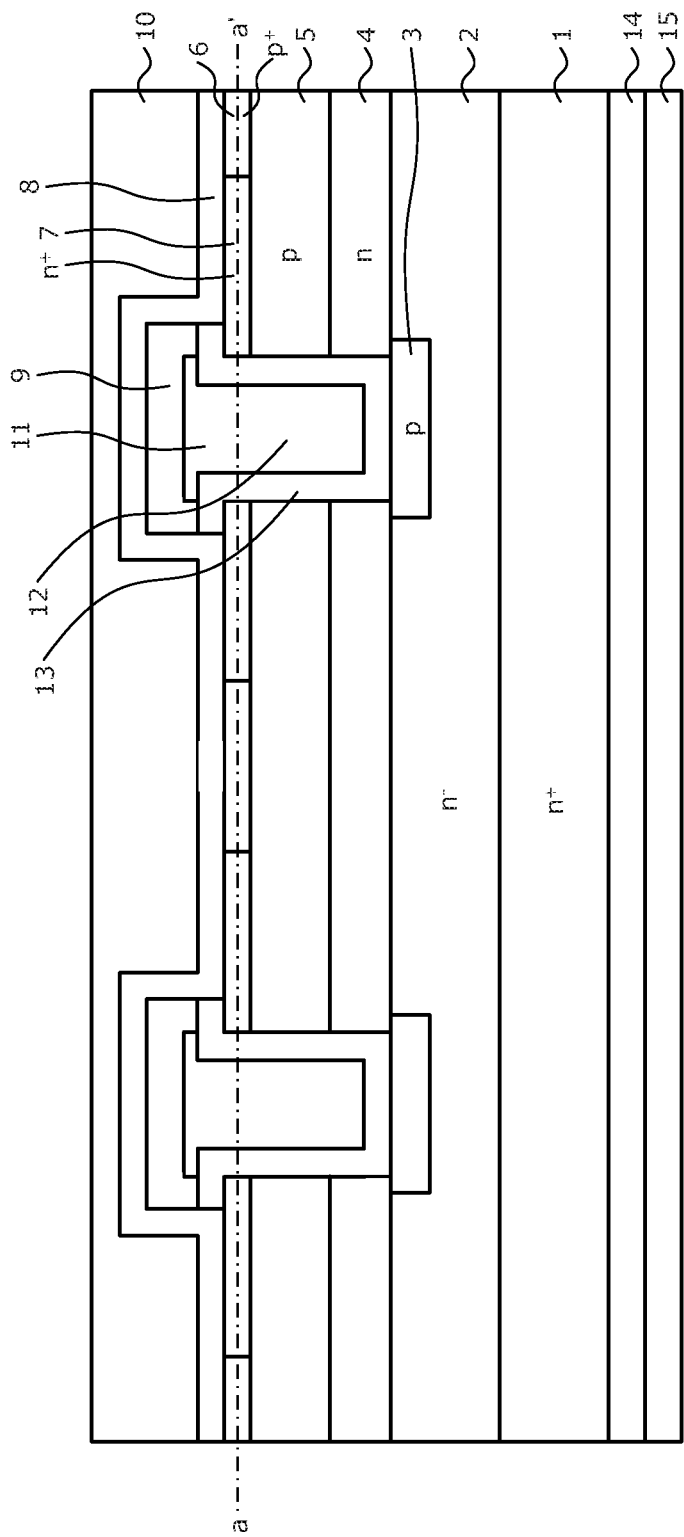
FIG. 18 is a cross-sectional view of Example 1 of a trench MOSFET manufactured by a method of manufacturing a semiconductor device according to the embodiment.
Figure 19:
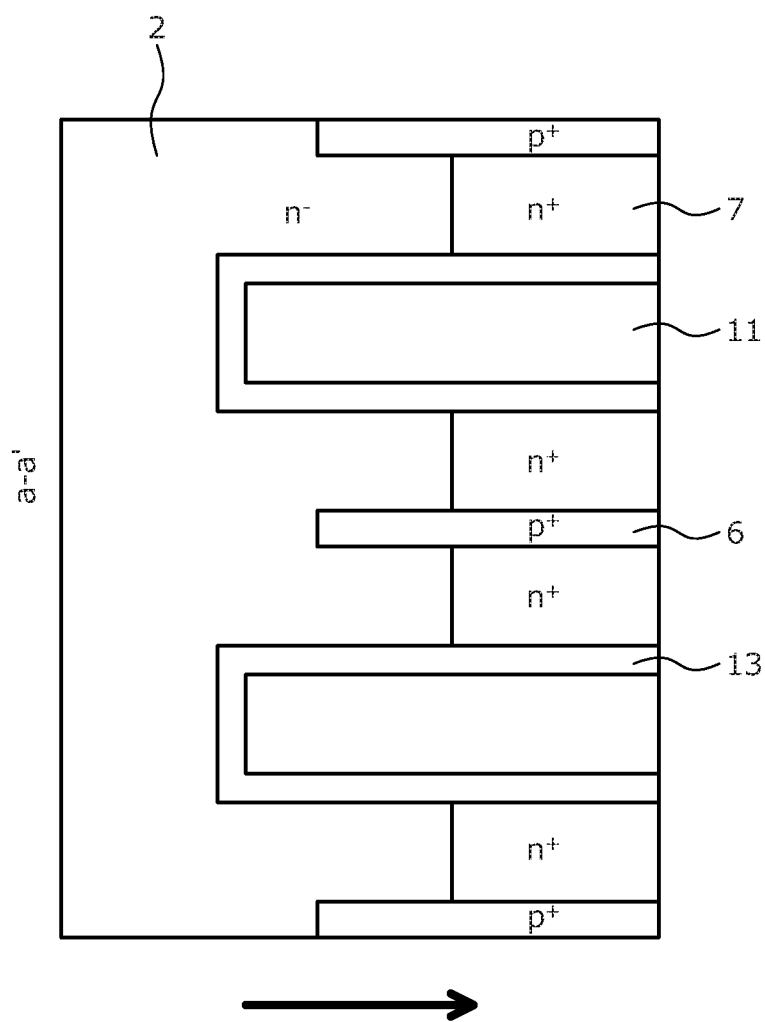
FIG. 19 is a plan diagram of a terminating portion of an a-a' portion of Example 1 of the trench MOSFET manufactured by the method of manufacturing a semiconductor device according to the embodiment.

FIG. 18 is a cross-sectional view of Example 1 of the trench MOSFET manufactured by the method of manufacturing a semiconductor device according to the embodiment. FIG. 19 is a plan diagram of a terminating portion of an a-a' portion of Example 1 of the trench MOSFET manufactured by the method of manufacturing a semiconductor device according to the embodiment. In FIG. 19, an arrow indicates the substrate off-direction. As depicted in FIG. 19, the trench 11 has a striped structure that extends in the substrate off-direction and the terminating portion is cut off thereat. In FIG. 19, though (not depicted), the p-type embedded layer 3 is formed beneath the trench 11, the gate oxide film 13, and the $n^-$-type drift layer 2.

Figure 20:
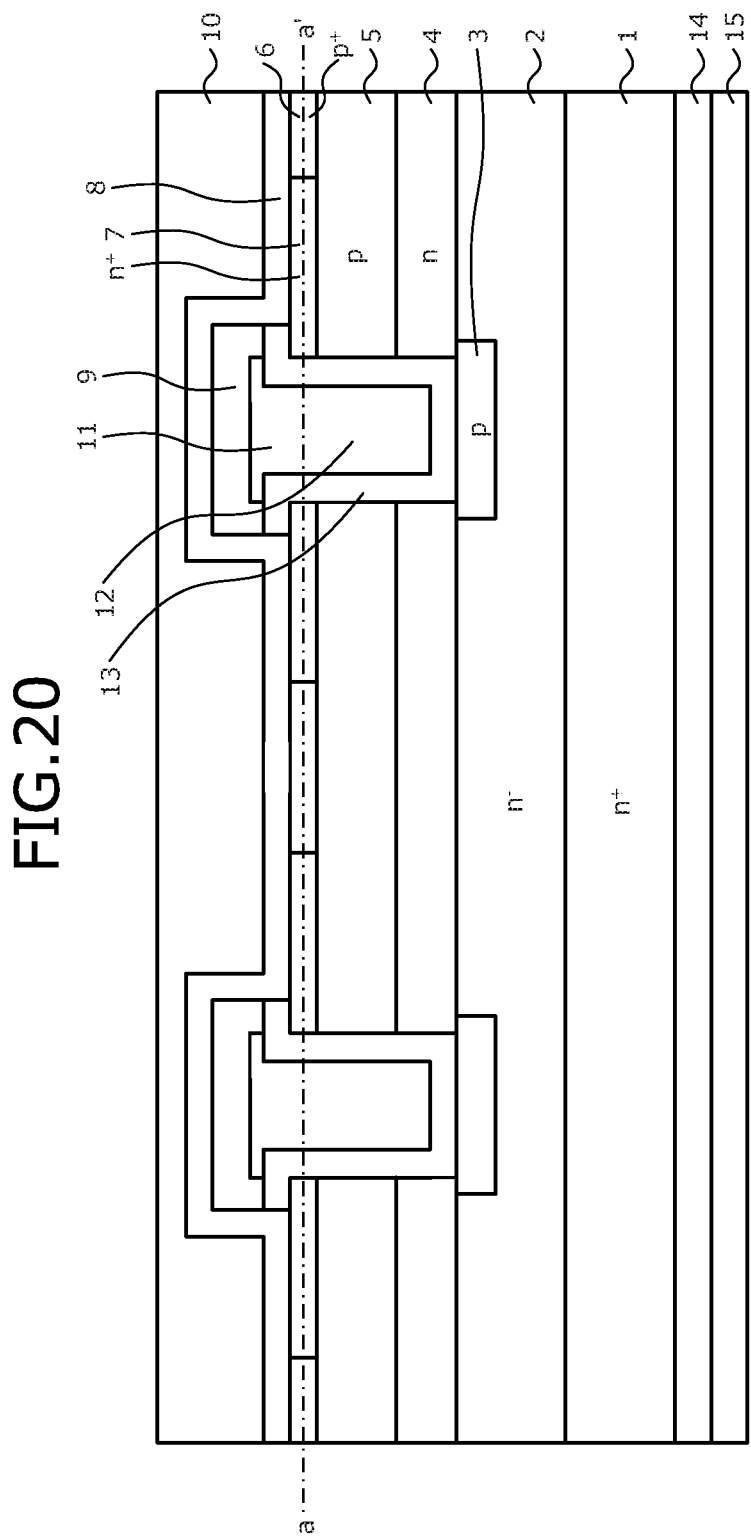
FIG. 20 is a cross-sectional view of Example 2 of a trench MOSFET manufactured by the method of manufacturing a semiconductor device according to the embodiment.
Figure 21:
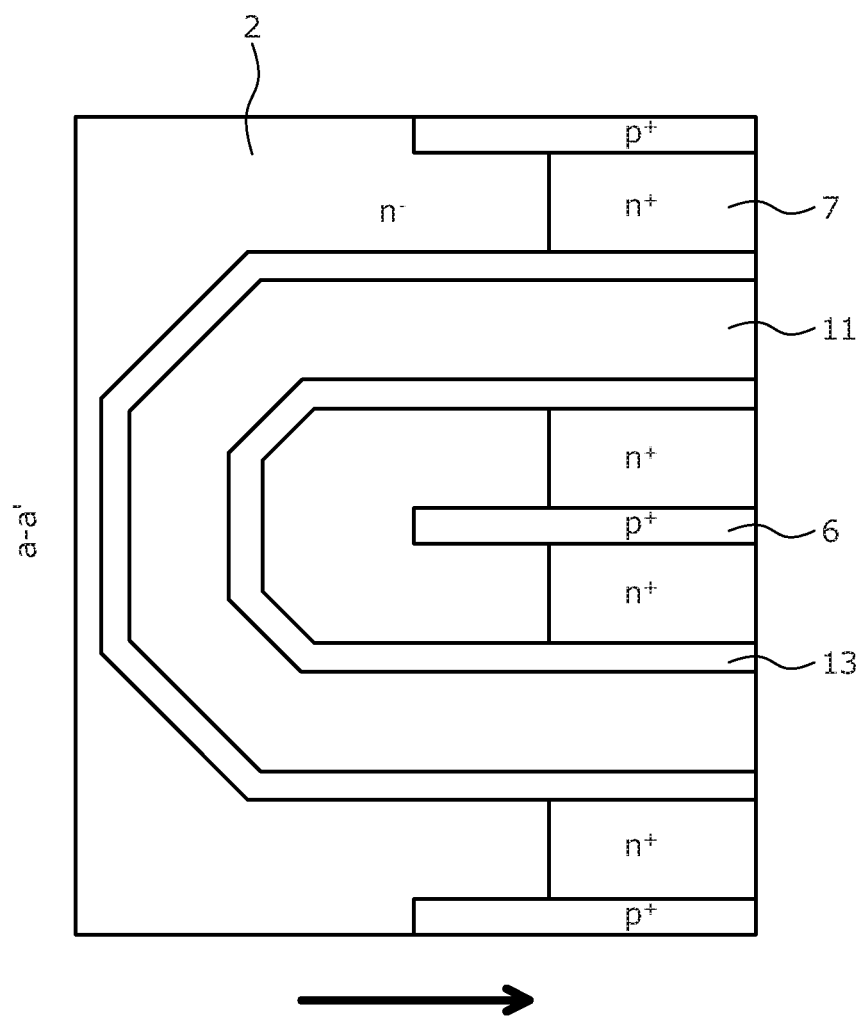
FIG. 21 is a plan diagram of a terminating portion of an a-a' portion of Example 2 of the trench MOSFET manufactured by the method of manufacturing a semiconductor device according to the embodiment.

FIG. 20 is a cross-sectional view of Example 2 of the trench MOSFET manufactured by the method of manufacturing a semiconductor device according to the embodiment. FIG. 21 is a plan diagram of a terminating portion of an a-a' portion of Example 2 of the trench MOSFET manufactured by the method of manufacturing a semiconductor device according to the embodiment. In FIG. 21, an arrow indicates the substrate off-direction. As depicted in FIG. 21, the trench 11 has a striped structure that extends in the substrate off-direction and the terminating portion is arranged to communicate with a neighboring trench 11.

Figure 22A:
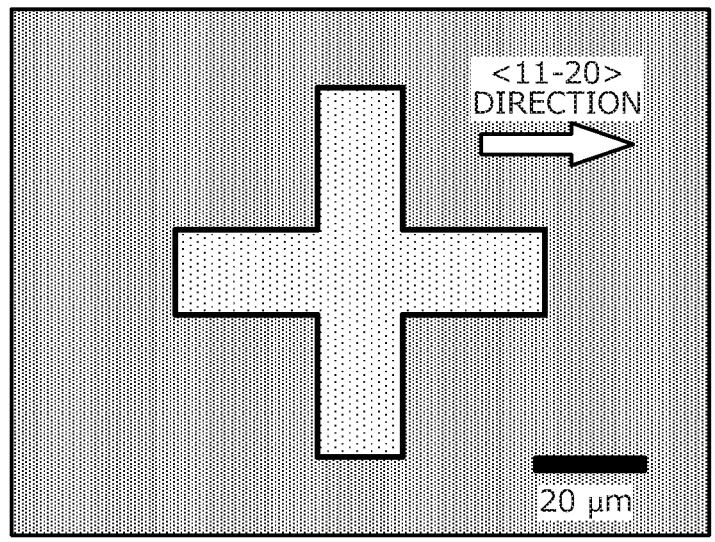
FIG. 22A and 22B are diagrams of deformations of marker patterns caused by epitaxial growth in Example 1 and Example 2.
Figure 22B:
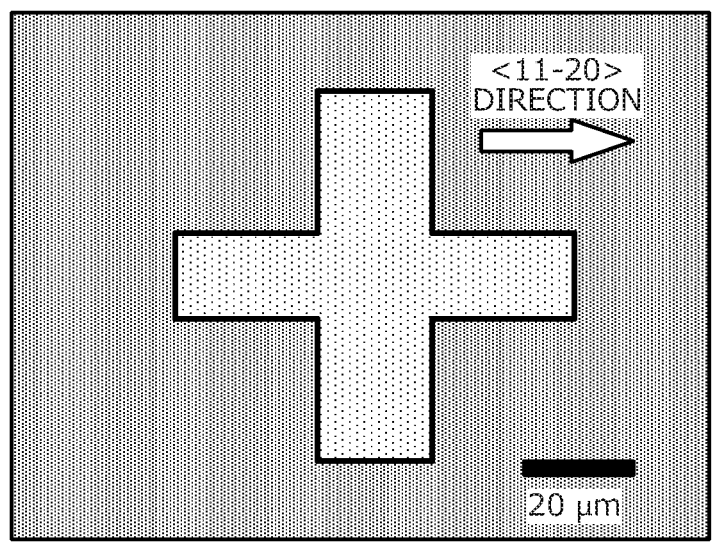

FIGS. 22A and 22B are diagrams of the deformations of the marker patterns caused by the epitaxial growth in Example 1 and Example 2. As depicted in FIGS. 22A and 22B, each of the alignment markers deformed in the direction for the width thereof to be increased in the <11-20> direction between before and after the formation of the n-type epitaxial layer 4 and the formation of the p-type epitaxial layer 5, and the variation of the width was 3 μm at most. At the photolithography process, because the alignment is performed using the center of the cross marker, at most an alignment shift of 1.5 μm may occur in the <11-20> direction.

Therefore, the mesa end portion 16 and the end portion of the p-type embedded layer 3 may be shifted with respect to each other by 1.5 μm at most when the mesa end portion 16 is formed using the position of the cross marker as the reference. In a case where the distance L between the mesa end portion 16 and the end portion of the p-type embedded layer 3 is set to be 3 μm, even when the position for the mesa end portion 16 to be formed at is shifted, the p-type embedded layer 3 may be provided beneath the mesa end portion 16. In a case where the distance M between the end portion of the p-type embedded layer 3 and the JTE edge termination structure 17 is set to be 4 μm, even when the position at which the mesa end portion 16 to be formed shifts, the p-type embedded layer 3 is not provided in the portion in which the edge termination structure 17 is to be formed, and the edge termination structure 17 may be provided.

In each of Example 1 and Example 2, because the alignment marker was deformed only in the <11-20> direction, when the trench 11 is formed using the alignment marker as the reference, the p-type embedded layer 3 may be provided in the bottom of the trench 11.

The breakdown electric field of the gate oxide film 13 of the trench MOSFET manufactured in each of Example 1 and Example 2 was evaluated and, in the conventional trench MOSFET, breakdown occurred at 1 MV/cm while, in the trench MOSFET of the present invention, no breakdown occurred up to 3 MV/cm or higher and the effect of protecting the gate oxide film 13 by the p-type embedded layer 3 was properly achieved.

As described, according to the embodiment, deformation of the marker pattern in the width direction of the trench may be reduced by setting the longitudinal direction of the trench to be the direction parallel to the off-direction of the $n^+$-type silicon carbide substrate. Shifting of the p-type embedded layer and the trench bottom with respect to each other thereby tends to be avoided and the width of the p-type embedded layer does not need to be increased. Increases in the resistance of the drift layer and the source layer may be prevented. The cell pitch of the semiconductor device may be reduced because the width of the p-type embedded layer is not increased.

By setting the p-type embedded layer to be longer than the p-type epitaxial layer in the direction of the edge termination structure, the p-type embedded layer may be prevented from not being arranged beneath the mesa end portion and the mesa end portion may be protected from strong electric field generated during the operation of the element. By setting the distance between the p-type embedded layer and the edge termination region to be longer than the distance between the end portion of the p-type embedded layer and the mesa end portion, a state in which the edge termination region may not be formed may be prevented.

Although the first conductivity type is set to be an "n-type" and the second conductivity type is set to be a "p-type" in the embodiments, the present invention is similarly implemented when the first conductivity type is set to be a "p-type" and the second conductivity type is set to be an "n-type".

According to the present invention, deformation of the marker pattern in the width direction of the trench may be reduced by setting the longitudinal direction of the trench to be a direction parallel to the off-direction of the $n^+$-type silicon carbide substrate. As a result, instances where the positions of the p-type embedded layer and the trench bottom are shifted from with respect to each other decrease and the width of the p-type embedded layer does not need to be increased. Therefore, increases in the resistance of the drift layer and the source layer may be prevented. The cell pitch of the semiconductor device may be reduced because the width of the p-type embedded layer is not increased.

According to the silicon carbide semiconductor device and the method of manufacturing a silicon carbide semiconductor device of the present invention, an effect is achieved in that instances where the positions of the components in the semiconductor device are shifted with respect to each other may be reduced by reducing the effect of the deformation of the marker pattern caused by the epitaxial growth method.

As described, the semiconductor device and the method of manufacturing a semiconductor device according to the present invention are useful for a high voltage semiconductor devices used in a power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide substrate of a first conductivity type;
   a drift layer of the first conductivity type provided on a front surface of the silicon carbide substrate, an impurity concentration of the drift layer being lower than that of the silicon carbide substrate;
   an embedded layer of a second conductivity type selectively provided in a surface layer of the drift layer at a first side thereof, which is opposite to a second side of the drift layer facing the silicon carbide substrate;
   an epitaxial layer of the first conductivity type provided on the drift layer at the first side thereof, an impurity concentration of the epitaxial layer being higher than that of the drift layer;
   a channel layer of the second conductivity type provided on the epitaxial layer at a first side thereof, which is opposite to a second side of the epitaxial layer facing the silicon carbide substrate, an end of the channel layer in a direction parallel to the longitudinal direction of the trench being positioned directly above the embedded layer, the end being within the embedded layer in a plan view of the silicon carbide semiconductor device;
   a source region of the first conductivity type selectively provided in a surface layer of the channel layer at a first side thereof, which is opposite to a second side of the channel layer facing the silicon carbide substrate;
   a trench penetrating the source region and the channel layer, and reaching the epitaxial layer;
   a gate electrode provided in the trench via a gate insulating film;
   a source electrode in contact with the channel layer and the source region;
   a drain electrode provided on a rear surface of the silicon carbide substrate;
   a mesa structure disposed near the channel layer; and
   an edge termination region provided in an outer periphery of the silicon carbide substrate, wherein
   the embedded layer is arranged underneath the trench in a depth direction of the trench;
   a longitudinal direction of the trench, which is perpendicular to the depth direction of the trench, is parallel to an off-direction of the silicon carbide substrate, and
   a first distance between an end of the embedded layer and an end of the channel layer, in a direction from the mesa structure to the edge termination region, is smaller than a second distance between the edge termination region and the end of the embedded layer, in the direction from the mesa structure to the edge termination region.

2. The silicon carbide semiconductor device according to claim 1, wherein
   the first distance between the end of the embedded layer and the end of the channel layer is in a range of 1 μm to 100 μm.

3. The silicon carbide semiconductor device according to claim 1, wherein
   the off-direction of the silicon carbide substrate is a <11-20>direction, and
   the longitudinal direction of the trench is a <11-20>direction.

4. The silicon carbide semiconductor device according to claim 1, wherein the embedded layer arranged underneath the trench serves a protection area for protecting the gate insulating film disposed inside of the trench.

5. A method of manufacturing a silicon carbide semiconductor device, the method comprising:
   providing a silicon carbide substrate of a first conductivity type;
   forming a drift layer of the first conductivity type on a front surface of the silicon carbide substrate, an impurity concentration of the drift layer being lower than that of the silicon carbide substrate;
   selectively forming an embedded layer of a second conductivity type in a surface layer of the drift layer;
   forming an epitaxial layer of the first conductivity type on the drift layer, an impurity concentration of the epitaxial layer being higher than that of the drift layer;
   forming a channel layer of the second conductivity type provided on the epitaxial layer;
   selectively forming a source region of the first conductivity type in a surface layer of the channel layer;
   forming a trench penetrating the source region and the channel layer and reaching the epitaxial layer, the trench facing the embedded layer in a depth direction of the trench, a longitudinal direction of the trench, which is perpendicular to the depth direction, being parallel to an off-direction of the silicon carbide substrate, an end of the channel layer in a direction parallel to the longitudinal direction of the trench being positioned directly above the embedded layer, the end being within the embedded layer in a plan view of the silicon carbide semiconductor device;
   forming a gate electrode in the trench via a gate insulating film;
   forming an interlayer insulating film on the gate electrode;
   forming a source electrode in contact with the channel layer and the source region;
   forming a drain electrode on a rear surface of the silicon carbide substrate;
   forming an edge termination region in an outer periphery of the silicon carbide substrate; and
   partially removing the channel layer, so that a first distance between an end of the embedded layer and an end of the channel layer, in a direction from a mesa structure to the edge termination region, is smaller than a second distance between the edge termination region and the end of the embedded layer, in the direction from the mesa structure to the edge termination region.

6. The method according to claim 5, wherein
   the first distance between the end of the embedded layer and the end of the channel layer is in a range of 1 μm to 100 μm.

7. The method according to claim 5, wherein
the epitaxial layer and the channel layer are formed by epitaxial growth.

8. The method according to claim 5, wherein the embedded layer arranged underneath the trench serves a protection area for protecting the gate insulating film disposed inside of the trench.

* * * * *